(12) United States Patent
Akagi et al.

(10) Patent No.: US 12,124,164 B2
(45) Date of Patent: Oct. 22, 2024

(54) REFLECTIVE MASK BLANK AND REFLECTIVE MASK

(71) Applicant: AGC Inc., Tokyo (JP)

(72) Inventors: Daijiro Akagi, Tokyo (JP); Takuma Kato, Tokyo (JP); Keishi Tsukiyama, Tokyo (JP); Toshiyuki Uno, Fukushima (JP); Hiroshi Hanekawa, Tokyo (JP); Ryusuke Oishi, Fukushima (JP); Sadatatsu Ikeda, Fukushima (JP); Yukihiro Iwata, Fukushima (JP); Chikako Hanzawa, Fukushima (JP)

(73) Assignee: AGC Inc., Tokyo (JP)

( * ) Notice: Subject to any disclaimer, the term of this patent is extended or adjusted under 35 U.S.C. 154(b) by 0 days.

(21) Appl. No.: 18/621,502

(22) Filed: Mar. 29, 2024

(65) Prior Publication Data

US 2024/0241433 A1 Jul. 18, 2024

Related U.S. Application Data

(63) Continuation of application No. PCT/JP2023/025748, filed on Jul. 12, 2023.

(30) Foreign Application Priority Data

Jul. 25, 2022 (JP) ................................. 2022-117803

(51) Int. Cl.
*G03F 1/24* (2012.01)
*G03F 1/48* (2012.01)

(52) U.S. Cl.
CPC ................. *G03F 1/24* (2013.01); *G03F 1/48* (2013.01)

(58) Field of Classification Search
CPC ...................................... G03F 1/24; G03F 1/48

USPC ............................................................ 430/5
See application file for complete search history.

(56) References Cited

U.S. PATENT DOCUMENTS

| | | | |
|---|---|---|---|
| 2012/0231378 | A1 | 9/2012 | Mikami et al. |
| 2014/0186752 | A1 | 7/2014 | Kinoshita et al. |
| 2015/0160548 | A1 | 6/2015 | Mikami |
| 2022/0075254 | A1 | 3/2022 | Inazuki et al. |

FOREIGN PATENT DOCUMENTS

| | | |
|---|---|---|
| JP | 2007-251205 A | 9/2007 |
| JP | 2014-127630 A | 7/2014 |
| JP | 2014-170931 A | 9/2014 |
| JP | 2015-109366 A | 6/2015 |
| JP | 2022-045936 A | 3/2022 |
| WO | WO 2011/071123 | 6/2011 |

OTHER PUBLICATIONS

International Search Report issued Sep. 5, 2023, in PCT/JP2023/025748, filed on Jul. 12, 2023 (5 pages).
Written Opinion of the International Searching Authority issued Aug. 24, 2023, in PCT/JP2023/025748 (4 pages).

*Primary Examiner* — Christopher G Young
(74) *Attorney, Agent, or Firm* — Oblon, McClelland, Maier & Neustadt, L.L.P.

(57) ABSTRACT

A reflective mask blank includes a substrate, a multilayered reflection film configured to reflect EUV rays, a protection film configured to protect the multilayered reflection film, and an absorption film configured to absorb the EUV rays in this order. The protection film contains Rh as a main component. The multilayered reflection film includes an uppermost layer that is closest to the protection film in the multilayered reflection film and contains Si and N. In the uppermost layer, an element ratio (N/Si) of N to Si is greater than 0.00 and less than 1.50, and an element ratio (O/Si) of O to Si is 0.00 or greater and less than 0.44.

7 Claims, 10 Drawing Sheets

FIG.1
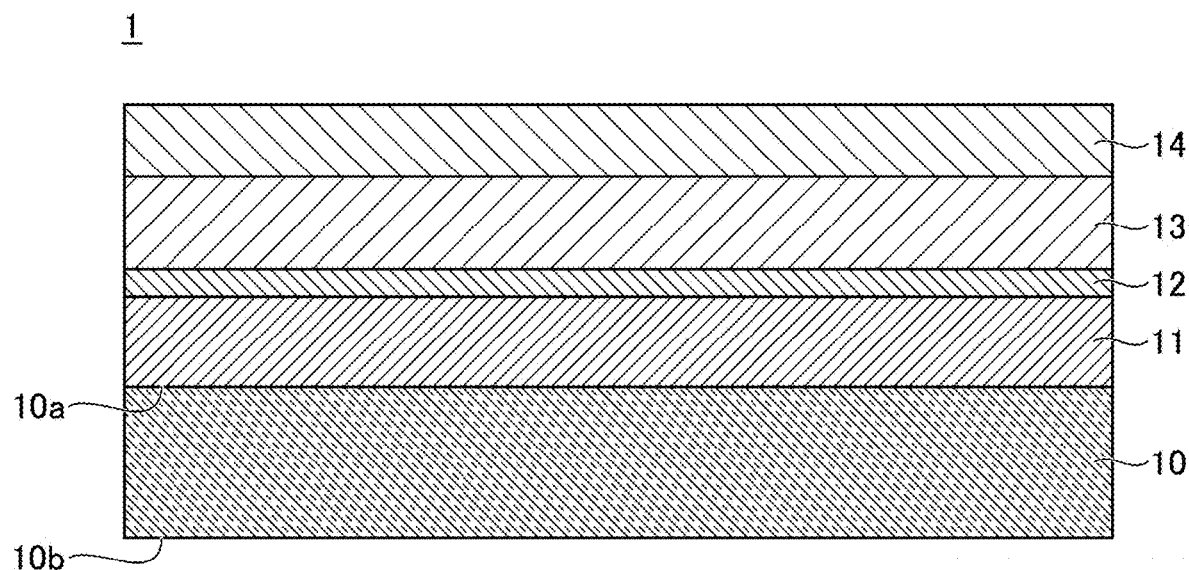
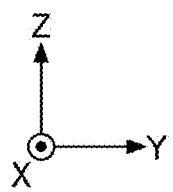

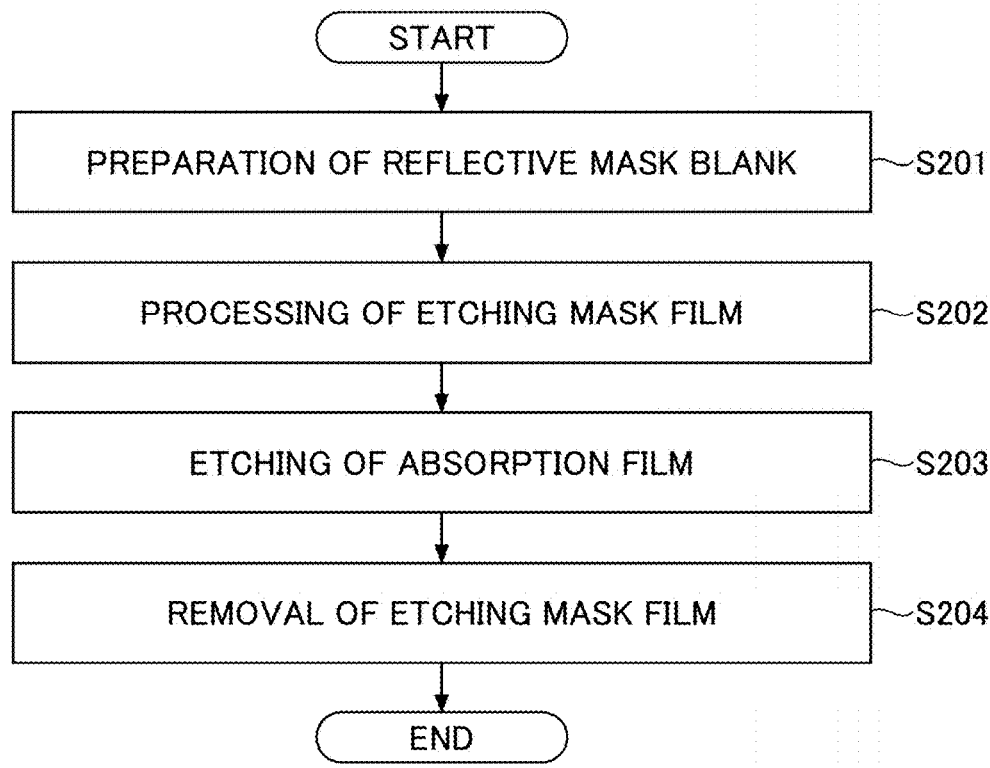
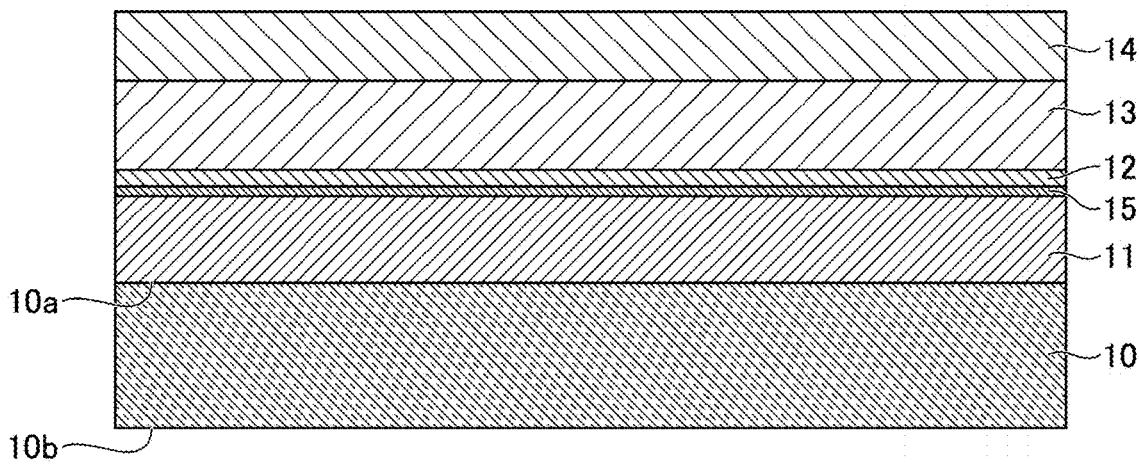

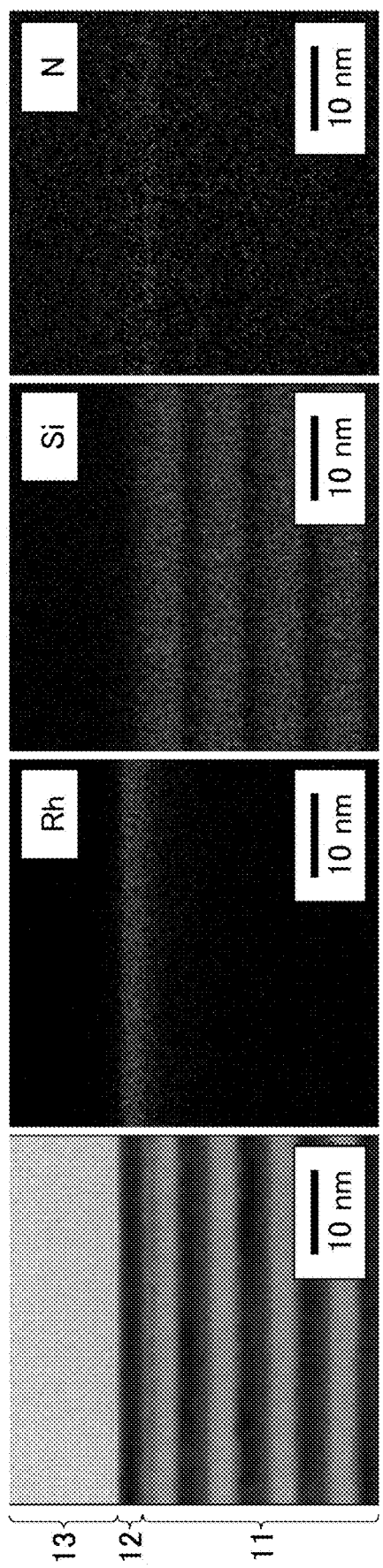

REFLECTIVE MASK BLANK AND REFLECTIVE MASK

CROSS-REFERENCE TO RELATED APPLICATIONS

This application is a continuation application of International Application No. PCT/JP2023/025748, filed on Jul. 12, 2023, and designating the U.S., which is based upon and claims priority to Japanese Patent Application No. 2022-117803, filed on Jul. 25, 2022, the entire contents of which are incorporated herein by reference.

BACKGROUND

Technical Field

The present disclosure relates to a reflective mask blank and a reflective mask.

Background Art

In recent years, along with miniaturization of semiconductor devices, Extreme Ultra-Violet Lithography (EUVL), which is an exposure technique utilizing Extreme Ultra-Violet (EUV), has been under development. EUV encompasses soft X-rays and vacuum ultraviolet rays, and, to be more specific, represents light having a wavelength of approximately from 0.2 nm through 100 nm. Currently, EUV having a wavelength of approximately 13.5 nm is mainly being studied.

The EUVL uses reflective masks. A reflective mask includes a substrate such as a glass substrate or the like, a multilayered reflection film configured to reflect EUV rays, a protection film configured to protect the multilayered reflection film, and an absorption film configured to absorb EUV rays in this order. The absorption film may be a phase shift film configured to shift phases of EUV rays. An opening pattern is formed in the absorption film. The EUVL transfers the opening pattern in the absorption film to a target substrate such as a semiconductor substrate and the like. Transferring includes transferring in a reduced size.

The reflective mask of Japanese Patent Application Laid-Open No. 2014-170931 includes a substrate, a multilayered reflection film, a reflectance decay inhibiting film, a blocking film, an etching stopper film, and an absorption film in this order. The reflectance decay inhibiting film is made of Si or the like. The blocking film is made of Nd or the like, and is configured to inhibit Si, which forms the reflectance decay inhibiting film, from diffusing to the etching stopper film. The etching stopper film is made of Ru or an Ru alloy.

SUMMARY

A reflective mask includes a substrate such as a glass substrate or the like, a multilayered reflection film configured to reflect EUV rays, a protection film configured to protect the multilayered reflection film, and an absorption film configured to absorb EUV rays in this order. The protection film protects the multilayered reflection film from an etching gas when forming an opening pattern in the absorption film using the etching gas. The etching gas is, for example, a halogen-based gas, an oxygen-based gas, or a mixture gas of these.

Even when exposed to the etching gas, the protection film remains on the multilayered reflection film without being removed. The protection film of Japanese Patent Application Laid-Open No. 2014-170931 is made of Ru or an Ru alloy. In cases where the main component of the protection film has been Ru, the protection film has failed to have a sufficient etching resistance. Particularly, in cases where an oxygen-based gas has been used as the etching gas (also including cases where a mixture gas has been used), the protection film has failed to have a sufficient etching resistance.

In an embodiment of the present disclosure, a technique for improving the etching resistance of a protection film while also inhibiting mixing of the protection film and the multilayered reflection film, surface roughening of the protection film, and elemental diffusion to the surface of the protection film is provided.

A reflective mask blank according to an embodiment of the present disclosure includes a substrate, a multilayered reflection film configured to reflect EUV rays, a protection film configured to protect the multilayered reflection film, and an absorption film configured to absorb the EUV rays in this order. The protection film contains Rh as a main component. The multilayered reflection film includes an uppermost layer that is closest to the protection film in the multilayered reflection film and contains Si and N. In the uppermost layer, an element ratio (N/Si) of N to Si is greater than 0.00 and less than 1.50, and an element ratio (O/Si) of O to Si is 0.00 or greater and less than 0.44.

According to an embodiment of the present disclosure, use of a protection film containing Rh as a main component can improve the etching resistance of the protection film. Containing the element ratios (N/Si and O/Si) in the uppermost layer of the multilayered reflection film in the ranges described above can inhibit mixing of the protection film and the multilayered reflection film, surface roughening of the protection film, and elemental diffusion to the surface of the protection film.

BRIEF DESCRIPTION OF THE DRAWINGS

FIG. 1 is a cross-sectional view illustrating a reflective mask blank according to an embodiment;

FIG. 5 is a flowchart illustrating a method for producing a reflective mask according to an embodiment;

FIG. 6 is a cross-sectional view illustrating a reflective mask black according to a modified example;

FIG. 7 is a drawing illustrating a STEM image and elemental mapping images of a reflective mask blank of Example 1;

DESCRIPTION OF EMBODIMENTS

Figure 2:
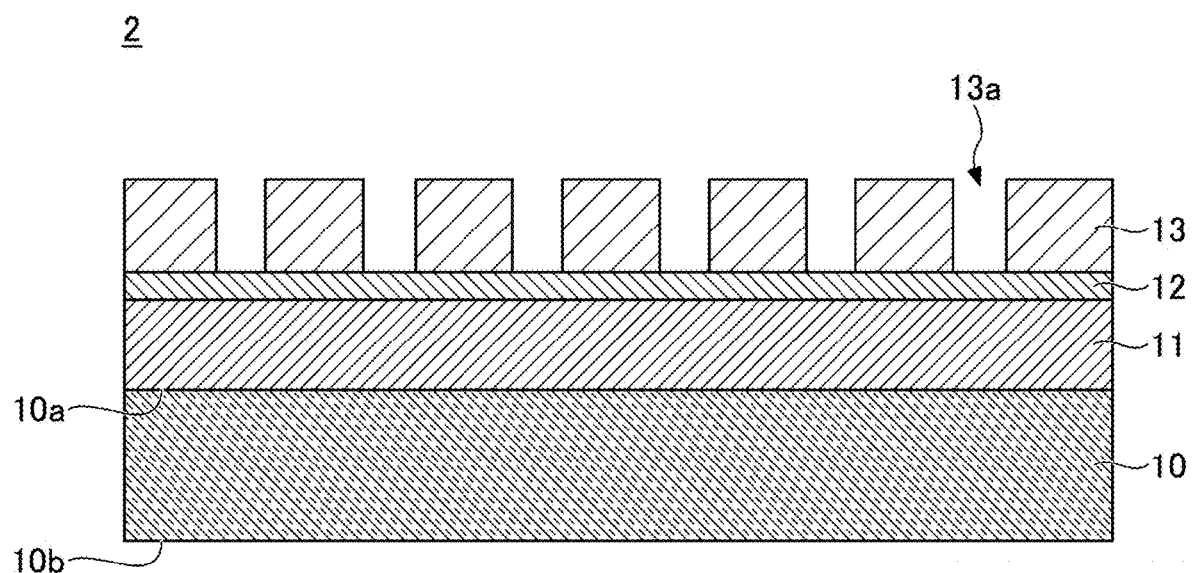
FIG. 2 is a cross-sectional view illustrating a reflective mask according to an embodiment.

An embodiment for carrying out the present disclosure will be described below with reference to the drawings. The same or corresponding components in the drawings will be denoted by the same reference numerals, and description of such components may be omitted. In the specification, "through" indicating numerical ranges means that the values specified before and after "through" are included as the lower limit and the upper limit.

Figure 3:
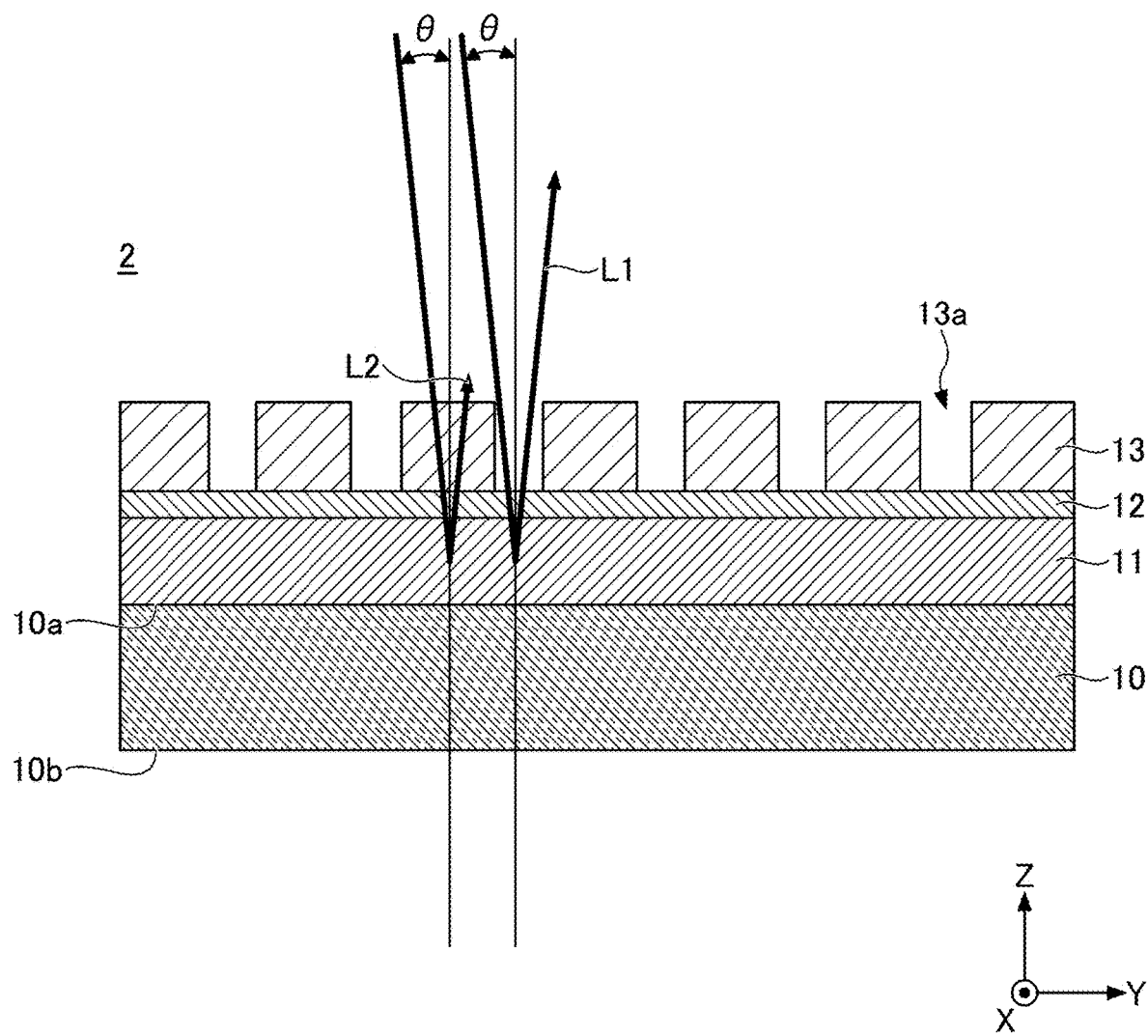
FIG. 3 is a cross-sectional view illustrating an example of EUV rays reflected by the reflective mask of FIG. 2.

In FIG. 1 to FIG. 3, the X-axis direction, the Y-axis direction, and the Z-axis direction are directions orthogonal to one another. The Z-axis direction is a direction perpendicular to a first principal surface 10a of a substrate 10. The X-axis direction is a direction orthogonal to an EUV ray-incident plane (i.e., a plane including incident rays and reflected rays). As illustrated in FIG. 3, incident rays incline further along the Y-axis positive direction as they propagate in the Z-axis negative direction, and reflected rays incline further along the Y-axis positive direction as they propagate in the Z-axis positive direction.

A reflective mask blank 1 according to an embodiment will be described with reference to FIG. 1. A reflective mask blank 1 includes, for example, the substrate 10, a multilayered reflection film 11, a protection film 12, an absorption film 13, and an etching mask film 14 in this order. The multilayered reflection film 11, the protection film 12, the absorption film 13, and the etching mask film 14 are formed in this order over the first principal surface 10a of the substrate 10. The reflective mask blank 1 needs only to include at least the substrate 10, the multilayered reflection film 11, the protection film 12, and the absorption film 13.

The reflective mask blank 1 may further include a functional film not illustrated in FIG. 1. For example, the reflective mask blank 1 may include a conductive film on a side of the substrate 10 opposite to the multilayered reflection film 11's side. The conductive film is formed over a second principal surface 10b of the substrate 10. The second principal surface 10b is a surface opposite to the first principal surface 10a. The conductive film is used for, for example, adsorbing a reflective mask 2 to an electrostatic chuck of an exposure device.

Although illustration is omitted, the reflective mask blank 1 may include a buffer film between the protection film 12 and the absorption film 13. The buffer film is configured to protect the protection film 12 from an etching gas for forming an opening pattern 13a in the absorption film 13. The buffer film is etched more slowly than is the absorption film 13. Unlike the protection film 12, the buffer film will ultimately have the same opening pattern as the opening pattern 13a in the absorption film 13.

Next, the reflective mask 2 according to an embodiment will be described with reference to FIG. 2 and FIG. 3. For example, the reflective mask 2 is produced using the reflective mask blank 1 illustrated in FIG. 1, and includes the opening pattern 13a in the absorption film 13. The etching mask film 14 illustrated in FIG. 1 is removed after the opening pattern 13a is formed in the absorption film 13.

The EUVL transfers the opening pattern 13a in the absorption film 13 to a target substrate such as a semiconductor substrate and the like. Transferring includes transferring in a reduced size. The substrate 10, the multilayered reflection film 11, the protection film 12, the absorption film 13, and the etching mask film 14 will be described below in this order.

The substrate 10 is, for example, a glass substrate. As the material of the substrate 10, quartz glass containing $TiO_2$ is preferable. As compared with more common soda-lime glass, quartz glass has a smaller coefficient of linear expansion and undergoes less dimensional changes due to temperature changes. Quartz glass may contain from 80% by mass through 95% by mass of $SiO_2$, and from 4% by mass through 17% by mass of $TiO_2$. When the $TiO_2$ content is from 4% by mass through 17% by mass, the coefficient of linear expansion of quartz glass around room temperature is approximately zero, and quartz glass almost does not undergo dimensional changes at around room temperature. Quartz glass may contain a third component or an impurity other than $SiO_2$ and $TiO_2$. Examples of the material of the substrate 10 include: crystallized glass obtained by segregating a β-quartz solid solution; silicon; metals; and the like.

The substrate 10 has the first principal surface 10a and the second principal surface 10b opposite to the first principal surface 10a. The multilayered reflection film 11 and the like are formed over the first principal surface 10a. The size of the substrate 10 in a plan view (seen in the Z-axis direction) is, for example, 152 mm in length×152 mm in width. The length and the width may be 152 mm or greater. The first principal surface 10a and the second principal surface 10b each have, for example, a quality assurance region having, for example, a square shape in the center. The size of the quality assurance region is, for example, 142 mm in length× 142 mm in width. It is preferable that the quality assurance region of the first principal surface 10a has a root mean square roughness Rq of 0.15 nm or less and a flatness of 100 nm or less. It is preferable that the quality assurance region of the first principal surface 10a is free of flaws that cause phase defects.

The multilayered reflection film 11 is configured to reflect EUV rays. The multilayered reflection film 11 is a laminate in which, for example, high-refractive-index layers and low-refractive-index layers are alternated. The material of the high-refractive-index layer is, for example, silicon (Si). The material of the low-refractive-index layer is, for example, molybdenum (Mo). Hence, a Mo/Si multilayered reflection film is used. A Ru/Si multilayered reflection film, a Mo/Be multilayered reflection film, a Mo compound/Si compound multilayered reflection film, a Si/Mo/Ru multilayered reflection film, a Si/Mo/Ru/Mo multilayered reflection film, a Si/Ru/Mo/Ru multilayered reflection film, a Si/Ru/Mo multilayered reflection film, and the like may also be used as the multilayered reflection film 11.

The film thickness of each layer forming the multilayered reflection film 11 and the number of layer repeating units may be appropriately selected in accordance with the material of each layer and the reflectance with respect to EUV rays. The multilayered reflection film 11, in a case of it being a Mo/Si multilayered reflection film, can achieve a reflectance of 60% or higher with respect to EUV rays having an incident angle θ (see FIG. 3) of 6°, by Mo layers having a film thickness of 2.3±0.1 nm and Si layers having a film thickness of 4.5±0.1 nm being laminated in a layer repeating unit number of 30 or more and 60 or less. It is preferable that the multilayered reflection film 11 has a reflectance of 60% or higher with respect to EUV rays having an incident angle θ of 6°. The reflectance is more preferably 65% or higher.

Examples of the method for forming each layer forming the multilayered reflection film 11 include a DC sputtering method, a magnetron sputtering method, an ion beam sputtering method, and the like. Examples of the film forming conditions for Mo layers and for Si layers in a case of forming a Mo/Si multilayered reflection film by employing an ion beam sputtering method are as follows.

<Film Forming Conditions for Si Layers>
Target: Si target,
Sputtering gas: Ar gas,
Gas pressure: from 0.013 Pa through 0.027 Pa,
Ion accelerating voltage: from 300 V through 1,500 V, Film forming rate: from 0.030 nm/sec through 0.300 nm/sec,
Film thickness of Si layers: 4.5±0.1 nm,
<Film Forming Conditions for Mo Layers>
Target: Mo target,
Sputtering gas: Ar gas,
Gas pressure: from 0.013 MPa through 0.027 Pa,
Ion accelerating voltage: from 300 V through 1,500 V,
Film forming rate: from 0.030 nm/sec through 0.300 nm/sec,
Film thickness of Mo layers: 2.3±0.1 nm,
<Si Layer and Mo Layer Repeating Unit>
Repeating unit number: from 30 through 60 (preferably from 40 through 50).

For example, the uppermost layer of the multilayered reflection film 11 is formed through at least nitriding of a Si layer after the Si layer is formed. For example, a Si layer is nitrided by being exposed to a plasma of a nitrogen-containing gas. Nitriding using a plasma of a nitrogen-containing gas may also be referred to as radical nitriding below. In a case of performing radical nitriding after a Si layer is formed, the uppermost layer of the multilayered reflection film 11 means the radical-nitrided layer. After radical nitriding, the Si layer may be oxidized by being exposed to an air atmosphere. Oxidization using an air atmosphere may also be referred to as air oxidization below.

The uppermost layer of the multilayered reflection film 11 may be formed by a reactive sputtering method. The reactive sputtering method can control the element ratio (N/Si) of N to Si in the uppermost layer based on the content proportion of $N_2$ gas in the sputtering gas. The reactive sputtering method can control the element ratio (O/Si) of O to Si in the uppermost layer based on the content proportion of $O_2$ gas in the sputtering gas.

The multilayered reflection film 11 includes the uppermost layer that is closest to the protection film 12 in the multilayered reflection film 11 and contains Si and N. In the uppermost layer, the element ratio (N/Si) of N to Si is greater than 0.00 and less than 1.50 (0.00<(N/Si)<1.50), and the element ratio (O/Si) of O to Si is 0.00 or greater and less than 0.44 (0.00≤(O/Si)<0.44). In the present specification, the element ratio is a ratio by mole.

By containing the element ratios (N/Si and O/Si) in the uppermost layer of the multilayered reflection film 11 in the ranges described above, it is possible to inhibit mixing of the protection film 12 and the multilayered reflection film 11, surface roughening of the protection film 12, and elemental diffusion to the surface of the protection film 12, as will be described in detail in the Examples section.

Here, mixing of the protection film 12 and the multilayered reflection film 11 is a phenomenon that occurs during formation of the protection film 12. On the other hand, elemental diffusion to the surface of the protection film 12 is a phenomenon in which an easily oxidizable element (e.g., Si contained in the uppermost layer) diffuses to the surface of the protection film 12 by the protection film 12 being exposed to an oxygen-based gas when forming the opening pattern 13a in the absorption film 13 using the oxygen-based gas.

The element ratio (N/Si) in the uppermost layer of the multilayered reflection film 11 is greater than 0.00 and less than 1.50. As the element ratio (N/Si) is greater, it is possible to better inhibit mixing of the protection film 12 and the multilayered reflection film 11, and elemental diffusion to the surface of the protection film 12. Moreover, by the element ratio (N/Si) being less than 1.50, it is possible to inhibit reflectance decay with respect to EUV rays. The element ratio (N/Si) is preferably greater than 0.10 and less than 0.50, and more preferably greater 0.10 and less than 0.30.

The element ratio (O/Si) in the uppermost layer of the multilayered reflection film 11 is 0.00 or greater and less than 0.44. As the element ratio (O/Si) is greater, it is possible to better inhibit mixing of the protection film 12 and the multilayered reflection film 11, and elemental diffusion to the surface of the protection film 12. Moreover, by the element ratio (O/Si) being less than 0.44, it is possible to inhibit surface roughening of the protection film 12. The element ratio (O/Si) is preferably 0.00 or greater and 0.40 or less, more preferably 0.00 or greater and 0.30 or less, yet more preferably 0.00 or greater and less than 0.25, particularly preferably 0.00 or greater and less than 0.10, and most preferably 0.00.

The protection film 12 is formed between the multilayered reflection film 11 and the absorption film 13 and is configured to protect the multilayered reflection film 11. The protection film 12 protects the multilayered reflection film 11 from an etching gas for forming the opening pattern 13a (see FIG. 2) in the absorption film 13. The protection film 12 remains over the multilayered reflection film 11 without being removed even when exposed to the etching gas.

The etching gas is, for example, a halogen-based gas, an oxygen-based gas, or a mixture gas of these. Examples of the halogen-based gas include chlorine-based gases and fluorine-based gases. Examples of chlorine-based gases include $Cl_2$ gas, $SiCl_4$ gas, $CHCl_3$ gas, $CCl_4$ gas, $BCl_3$ gas, or mixture gases of these. Examples of fluorine-based gases include $CF_4$ gas, $CHF_3$ gas, $SF_6$ gas, $BF_3$ gas, $XeF_2$ gas, or mixture gases of these. Examples of oxygen-based gases include $O_2$ gas, $O_3$ gas), or mixture gases of these.

A ratio (ER2/ER1) of the etching rate ER2 of the absorption film 13 to the etching rate ER1 of the protection film 12 is also referred to as selectivity (ER2/ER1). As the selectivity (ER2/ER1) is greater, the absorption film 13 is more processable. The selectivity (ER2/ER1) is preferably 5.0 or greater, more preferably 10 or greater, and yet more preferably 30 or greater. The selectivity (ER2/ER1) is preferably 200 or less and more preferably 100 or less.

The protection film 12 contains Rh as a main component. The protection film 12 contains Rh in an amount of 50 at % or greater and 100 at % or less. By using Rh instead of Ru as the main component of the protection film 12, it is possible to improve the etching resistance of the protection film 12. Particularly, in a case where an oxygen-based gas is used as the etching gas (also including a case where a mixture gas is used), it is possible to improve the etching resistance of the protection film 12.

Rh is more inter-diffusible with Si than is Ru. Hence, the element ratios (N/Si and O/Si) in the uppermost layer of the multilayered reflection film 11 are more critical in a case where the protection film 12 contains Rh as a main component than in a case where the protection film 12 contains Ru as a main component. As long as the element ratios (N/Si and O/Si) in the uppermost layer of the multilayered reflection film 11 are in the ranges described above, it is possible to inhibit mixing of the uppermost layer of the multilayered reflection film 11 and the protection film 12. By inhibiting mixing, it is possible to inhibit reduction in the etching resistance, and reflectance decay with respect to EUV rays.

The protection film 12 may contain only Rh as a metal element, yet it is preferable that the protection film 12 contains a Rh compound. A Rh compound may contain at least one element Z1 selected from the group consisting of Ru, Nb, Mo, Ta, Ir, Pd, Zr, Y, and Ti in addition to Rh.

Preferably, the protection film 12 contains only Rh, or contains either or both of Ru and Pd in addition to Rh as a metal element.

By adding Ru, Nb, Mo, Zr, Y, or Ti to Rh, it is possible to restrict the extinction coefficient to be low while inhibiting increase in the refractive index, and to improve reflectance with respect to EUV rays. Moreover, by adding Ta, Ir, Pd, or Y to Rh, it is possible to improve durability against either or both of an etching gas and a sulfuric acid/hydrogen peroxide mixture. Sulfuric acid/hydrogen peroxide mixture is used for removing a resist film, washing the reflective mask 2, and the like described below.

The element ratio (Z1:Rh) between Z1 (all Z1) and Rh is preferably from 1:99 through 1:1. When the ratio (Z1/Rh) is 1/99 or greater, the reflectance with respect to EUV rays is good. When the ratio (Z1/Rh) is 1 or less, the protection film 12 has a good etching resistance. The element ratio (Z1:Rh) between Z1 and Rh is more preferably from 3:10 through 1:1.

In a case where Z1 is Ru, the element ratio (Ru/Rh) of Ru to Rh is preferably greater than 0.0 and less than 1.0 (0.0<(Ru/Rh)<1.0), and more preferably greater than 0.3 and less than 0.5 (0.3<(Ru/Rh)<0.5). In a case where the element ratio (Ru/Rh) is greater than 0.0, the reflectance with respect to EUV rays is good. In a case where the element ratio (Ru/Rh) is less than 1.0, the etching resistance is good.

In a case where Z1 is Pd, the element ratio (Pd/Rh) of Pd to Rh is preferably greater than 0.00 and less than 1.0 (0.00<(Pd/Rh)<1.0), and more preferably greater than 0.01 and less than 0.1 (0.01<(Pd/Rh)<0.1). In a case where the element ratio (Ru/Rh) is greater than 0.00, the etching resistance is good. In a case where the element ratio (Ru/Rh) is less than 1.0, the reflectance with respect to EUV rays is good.

The Rh compound may contain at least one element Z2 selected from the group consisting of N, O, C, and B in addition to Rh. Although the element Z2 disadvantageously reduces the etching resistance of the protection film 12, it can inhibit crystallization of the protection film 12 and make the surface of the protection film 12 smooth when the protection film 12 is formed. A Rh compound containing the element Z2 has a non-crystalline structure or a microcrystalline structure. In a case where the Rh compound has a non-crystalline structure or a microcrystalline structure, the X-ray diffraction profile of the Rh compound includes no clear peak.

In a case where the Rh compound contains Z2 in addition to Rh, it is preferable that the content of Rh (where the content of Z1 is 0 at %) or the total content of Rh and Z1 is from 40 at % through 99 at %, and that the total content of Z2 is from 1.0 at % through 60 at %. In a case where the Rh compound contains Z2 in addition to Rh, it is more preferable that the content of Rh (where the content of Z1 is 0 at %) or the total content of Rh and Z1 is from 80 at % through 99 at %, and that the total content of Z2 is from 1.0 at % through 20 at %.

In a case where the Rh compound contains Rh in an amount of 90 at % or greater, contains either or both of Z1 and Z2, and has a film density of from 10.0 g/cm$^3$ through 14.0 g/cm$^3$, the Rh compound has a non-crystalline structure or a microcrystalline structure. The film density of the protection film 12 is preferably from 11.0 g/cm$^3$ through 13.0 g/cm$^3$. In a case where the protection film 12 contains Rh in an amount of 100 at % and has a film density of from 11.0 g/cm$^3$ through 12.0 g/cm$^3$, the protection film 12 has a non-crystalline structure or a microcrystalline structure. The film density of the protection film 12 is measured using an X-ray reflectivity method.

The thickness of the protection film 12 is preferably from 1.0 nm through 4.0 nm, more preferably from 2.0 nm through 3.5 nm, and yet more preferably from 2.5 nm through 3.0 nm. In a case where the thickness of the protection film 12 is 1.0 nm or greater, the etching resistance is good. In a case where the thickness of the protection film 12 is 4.0 nm or less, the reflectance with respect to EUV rays is good.

The film density of the protection film 12 is preferably from 10.0 g/cm$^3$ through 14.0 g/cm$^3$. In a case where the film thickness of the protection film 12 is 10.0 g/cm$^3$ or greater, the etching resistance is good. In a case where the film density of the protection film 12 is 14.0 g/cm$^3$ or less, it is possible to inhibit reflectance decay with respect to EUV rays.

The root mean square roughness Rq of the upper surface of the protection film 12, i.e., the surface of the protection film 12 over which the absorption film 13 is formed is preferably 0.20 nm or less and more preferably 0.17 nm or less. As long as the root mean square roughness Rq is 0.20 nm or less, the absorption film 13 and the like can be formed over the protection film 12 smoothly. Moreover, the protection film 12 can inhibit scattering of EUV rays, and can improve the reflectance with respect to EUV rays. The root mean square roughness Rq is preferably 0.05 nm or greater.

Examples of the method for forming the protection film 12 include a DC sputtering method, a magnetron sputtering method, an ion beam sputtering method, and the like. An example of the film forming conditions in a case of forming a Rh film by employing a DC sputtering method is as follows.

<Film Forming Conditions for Rh Film>
Target: Rh target,
Sputtering gas: Ar gas,
Gas pressure: from $1.0 \times 10^{-2}$ Pa through $1.0 \times 10^0$ Pa,
Target output density: from 1.0 W/cm$^2$ through 8.5 W/cm$^2$,
Film forming rate: from 0.020 nm/sec through 1.000 nm/sec,
Film thickness of Rh film: from 1.0 nm through 4.0 nm.

In a case of forming a Rh film, N$_2$ gas or a mixture gas of Ar gas and N$_2$ may be used as the sputtering gas. The N$_2$ gas volume ratio (N$_2$/(Ar+N$_2$)) in the sputtering gas is 0.05 or greater and 1.0 or less.

An example of the film forming conditions in a case of forming a RhO film by employing a DC sputtering method is as follows.

<Film Forming Conditions for RhO Film>
Target: Rh target,
Sputtering gas: O$_2$ gas or a mixture gas of Ar gas and O$_2$,
O$_2$ gas volume ratio (O$_2$/(Ar+O$_2$)) in the sputtering gas: from 0.05 through 1.0,
Gas pressure: from $1.0 \times 10^{-2}$ Pa through $1.0 \times 10^0$ Pa,
Target output density: from 1.0 W/cm$^2$ through 8.5 W/cm$^2$,
Film forming rate: from 0.020 nm/sec through 1.000 nm/sec,
Film thickness of RhO film: from 1.0 nm through 4.0 nm.

An example of the film forming conditions in a case of forming a RhRu film by employing a DC sputtering method is as follows.

<Film Forming Conditions for RhRu Film>
  Target: Rh target and Ru target (or RhRu target),
  Sputtering gas: Ar gas,
  Gas pressure: from $1.0 \times 10^{-2}$ Pa through $1.0 \times 10^0$ Pa,
  Target output density: from 1.0 W/cm$^2$ through 8.5 W/cm$^2$,
  Film forming rate: from 0.020 nm/sec through 1.000 nm/sec,
  Film thickness of RhRu film: from 1.0 nm through 4.0 nm.

The absorption film 13 is configured to absorb EUV rays. The absorption film 13 is a film in which the opening pattern 13a is formed. The opening pattern 13a is not formed in the production step of the reflective mask blank 1, and is formed in the production step of the reflective mask 2. The absorption film 13 may be a phase shift film configured to not only absorb EUV rays but shift the phase of the EUV rays. The absorption film 13 shifts the phase of the second EUV ray L2 with respect to the first EUV ray L1 as illustrated in FIG. 3.

The first EUV ray L1 is a ray that passes through the opening pattern 13a instead of being transmitted through the absorption film 13, is reflected on the multilayered reflection film 11, and passes through the opening pattern 13a again instead of being transmitted through the absorption film 13. The second EUV ray L2 is a ray that is transmitted through the absorption film 13 while being absorbed by the absorption film 13, is reflected on the multilayered reflection film 11, and is transmitted through the absorption film 13 again while being absorbed by the absorption film 13.

The phase difference (≥0) between the first EUV ray L1 and the second EUV ray L2 is, for example, from 170° through 250°. The phase of the first EUV ray L1 may lead or follow the phase of the second EUV ray L2. The absorption film 13 improves the contrast of a transferred image by utilizing interference between the first EUV ray L1 and the second EUV ray L2. A transferred image is an image obtained by transferring the opening pattern 13a in the absorption film 13 to a target substrate.

In the EUVL, what is generally referred to as a shadowing effect occurs. The shadowing effect means a transferred image being mis-located or dimensionally inaccurate due to occurrence, near the side walls of the opening pattern 13a, of a region in which EUV rays are shielded by the side walls due to the incident angle θ of the EUV rays not being 0° (e.g., the incident angle θ of the EUV rays being 6°). In order to reduce the shadowing effect, it is effective to make the side walls of the opening pattern 13a short in height, and to make the absorption film 13 thin.

In order to reduce the shadowing effect, the film thickness of the absorption film 13 is, for example, 60 nm or shorter, and preferably 50 nm or shorter. In order to secure a phase difference between the first EUV ray L1 and the second EUV ray L2, the film thickness of the absorption film 13 is preferably 20 nm or greater and more preferably 30 nm or greater.

It is preferable that the absorption film 13 contains at least one metal element selected from Ru, Ta, Cr, Nb, Pt, Ir, Re, W, Mn, and Au. Because these metal elements have a relatively low refractive index, it is possible to secure a phase difference and to also make the film thickness of the phase shift film small. It is preferable that the absorption film 13 contains Ru among the metal elements mentioned above.

It is preferable that the absorption film 13 contains a compound of the metal elements mentioned above. The compound contains at least one non-metal element selected from O, N, C, and B in addition to the metal element mentioned above. By adding a non-metal element to the metal element, it is possible to inhibit crystallization of the absorption film 13 and to make the roughness of the side walls of the opening pattern 13a small. It is preferable that the absorption film 13 contains oxygen, and more preferably oxygen and nitrogen, as the non-metal element.

The refractive index n of the absorption film 13 is preferably 0.930 or less, more preferably 0.920 or less, yet more preferably 0.910 or less, and particularly preferably 0.90 or less. The refractive index n is preferably 0.885 or greater. In the present specification, the refractive index is a refractive index with respect to light having a wavelength of 13.5 nm.

The extinction coefficient k in the absorption film 13 is preferably 0.015 or greater and more preferably 0.020 or greater. The extinction coefficient k is preferably 0.065 or less. In the present specification, the extinction coefficient means the extinction coefficient of light having a wavelength of 13.5 nm.

As the optical properties (refractive index n and extinction coefficient k) in the absorption film 13, the values in the database of the Center for X-Ray Optics, Lawrence Berkeley National Laboratory, or values calculated based on the "incident angle dependency" of the reflectance described below are used.

The incident angle θ of EUV rays, the reflectance R with respect to EUV rays, the refractive index n in the absorption film 13, and the extinction coefficient k in the absorption film 13 satisfy the formula (1) below.

$$R = |(\sin\theta - ((n+ik)^2 - \cos^2\theta)^{1/2})/(\sin\theta + ((n+ik)^2 - \cos^2\theta)^{1/2})| \quad (1)$$

A plurality of sets of incident angle θ and reflectance R are measured, and the refractive index n and the extinction coefficient k are calculated by the least-squares method such that the error between the plurality of measurement data and the formula (1) becomes minimum.

The etching rate through the absorption film 13 by a sulfuric acid/hydrogen peroxide mixture is preferably from 0 nm/min through 0.05 nm/min. As long as the etching rate through the absorption film 13 by a sulfuric acid/hydrogen peroxide mixture is 0.05 nm/min or lower, it is possible to inhibit the absorption film 13 from being damaged during washing.

Examples of the film formation method for forming the absorption film 13 include a DC sputtering method, a magnetron sputtering method, an ion beam sputtering method, or reactive sputtering. Reactive sputtering can control the content of oxygen in the absorption film 13 based on the content of O$_2$ gas in the sputtering gas. Reactive sputtering can also control the content of nitrogen in the absorption film 13 based on the content of N$_2$ gas in the sputtering gas.

An example of the film forming conditions in a case of forming a RuN film as the absorption film 13 by employing the reactive sputtering method is as follows.

<Film Forming Conditions for RuN Film>
  Target: Ru target,
  Sputtering gas: a mixture gas of Ar gas and N$_2$ gas,
  N$_2$ gas volume ratio (N$_2$/(Ar+N$_2$)) in the sputtering gas: from 0.3 through 0.7,
  Gas pressure: from 0.05 Pa through 0.40 Pa,
  Target output density: from 1.0 W/cm$^2$ through 8.5 W/cm$^2$,
  Film forming rate: from 0.010 nm/sec through 0.030 nm/sec,
  Film thickness: from 20 nm through 60 nm.

The etching mask film 14 is formed on a side of the absorption film 13 opposite to the protection film 12 side, and is used for forming the opening pattern 13a in the absorption film 13. A non-illustrated resist film is formed over the etching mask film 14. In the production step of the reflective mask 2, a first opening pattern is formed in the resist film first, a second opening pattern is formed in the etching mask film 14 next using the first opening pattern, and then the third opening pattern 13a is formed in the absorption film 13 using the second opening pattern. The first opening pattern, the second opening pattern, and the third opening pattern 13a have the same dimensions and the same shape when seen in a plan view (when seen in the Z-axis direction). With the etching mask film 14, it is possible to use a thin resist film.

It is preferable that the etching mask film 14 contains at least one element selected from Al, Hf, Y, Cr, Nb, Ti, Mo, Ta, and Si. The etching mask film 14 may further contain at least one element selected from O, N, and B.

The film thickness of the etching mask film 14 is preferably 2 nm or greater and 30 nm or less, more preferably 2 nm or greater and 25 nm or less, and yet more preferably 2 nm or greater and 10 nm or less.

Examples of the film forming method for forming the etching mask film 14 include a DC sputtering method, a magnetron sputtering method, and an ion beam sputtering method.

Figure 4:
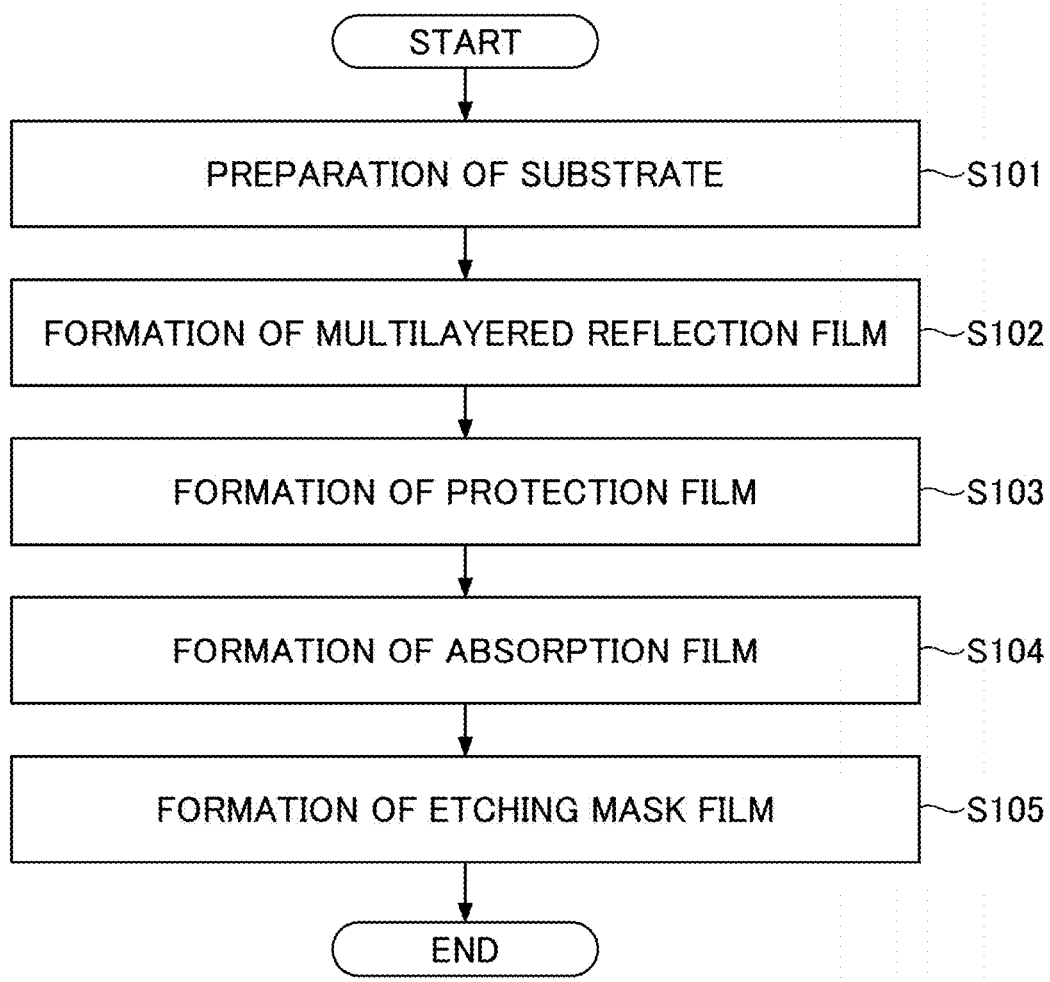
FIG. 4 is a flowchart illustrating a method for producing a reflective mask blank according to an embodiment.

Next, the method for producing the reflective mask blank 1 according to an embodiment will be described with reference to FIG. 4. For example, the method for producing the reflective mask blank 1 includes the steps S101 to S105 illustrated in FIG. 4. In the step S101, the substrate 10 is prepared. In the step S102, the multilayered reflection film 11 is formed over the first principal surface 10a of the substrate 10. In the step S103, the protection film 12 is formed over the multilayered reflection film 11. In the step S104, the absorption film 13 is formed over the protection film 12. In the step S105, the etching mask film 14 is formed over the absorption film 13.

The method for producing the reflective mask blank 1 needs only to include at least the steps S101 to S104. The method for producing the reflective mask blank 1 may further include a step of forming a functional film non-illustrated in FIG. 4.

Next, the method for producing the reflective mask 2 according to an embodiment will be described with reference to FIG. 5. The method for producing the reflective mask 2 includes the steps S201 through S204 illustrated in FIG. 5. In the step S201, the reflective mask blank 1 is prepared. In the step S202, the etching mask film 14 is processed. A non-illustrated resist film is formed over the etching mask film 14. The first opening pattern is formed in the resist film first, and the second opening pattern is formed in the etching mask film 14 next using the first opening pattern. In the step S203, the third opening pattern 13a is formed in the absorption film 13 using the second opening pattern. In the step S203, the absorption film 13 is etched using an etching gas. In the step S204, the resist film and the etching mask film 14 are removed. For example, a sulfuric acid/hydrogen peroxide mixture is used for removing the resist film. For example, an etching gas is used for etching the etching mask film 14. The etching gas used in the step S204 (removal of the etching mask film 14) may be the same type as the etching gas used in the step S202 (processing of the etching mask film 14). The method for producing the reflective mask 2 needs only to include at least the steps S201 and S203.

Next, the reflective mask blank 1 according to a modified example will be described with reference to FIG. 6. The reflective mask blank 1 may include a reflectance adjusting film 15 containing Ru as a main component between the multilayered reflection film 11 and the protection film 12. The extinction coefficient in Ru is lower than the extinction coefficient in Rh. By combining the protection film 12 containing Rh as a main component and the reflectance adjusting film 15 containing Ru as a main component, it is possible to improve the reflectance with respect to EUV rays while improving the etching resistance.

The reflectance adjusting film 15 contains Ru in an amount of 50 at % or greater and 100 at % or less. The reflectance adjusting film 15 needs only to contain Ru as a metal element, yet may contain a Ru compound. The Ru compound may contain at least one element selected from the group consisting of Pd, Ir, Pt, Zr, Nb, Ta, and Ti in addition to Ru.

The Ru compound may contain at least one non-metal element selected from O, N, C, and B in addition to Ru. Although the non-metal element disadvantageously reduces the etching resistance, it can inhibit crystallization of the reflectance adjusting film 15 and make the surface of the reflectance adjusting film 15 smooth.

The film thickness of the reflectance adjusting film 15 is preferably from 0.1 nm through 2.0 nm, more preferably from 0.5 nm through 2.0 nm, and yet more preferably from 1.0 nm through 1.5 nm. In a case where the film thickness of the reflectance adjusting film 15 is 0.1 nm or greater, the reflectance for EUV rays is good. In a case where the film thickness of the reflectance adjusting film 15 is 2.0 nm or less, etching resistance is good.

An example of the film forming conditions in a case of forming a Ru film as the reflectance adjusting film 15 by employing an ion beam sputtering method is as follows.

<Film Forming Conditions for Ru Film>

Target: Ru target,
Sputtering gas: Ar gas,
Gas pressure: from 0.010 Pa through 0.020 Pa,
Ion accelerating voltage: from 300 V through 1,500 V,
Film forming rate: from 0.010 nm/sec through 0.100 nm/sec,
Film thickness of Ru film: from 0.1 nm through 2.0 nm.

EXAMPLES

The following description will be described based on experiment data. In Example 1 to Example 10, reflective mask blanks 1 for EUVL were produced under the same conditions except the uppermost layer of the multilayered reflection film 11, and presence or absence of and the material of the reflectance adjusting film 15. Each reflective mask blank 1 was formed using the substrate 10, the multilayered reflection film 11, the protection film 12, and the absorption film 13. Example 1 to Example 3, Example 9, and Example 10 are Examples, and Example 4 to Example 8 are Comparative Examples.

As the substrate 10, a $SiO_2$—$TiO_2$-based glass substrate (having a 6-inch (152-mm) square outer shape, and a thickness of 6.3 mm) was prepared. The glass substrate had a coefficient of thermal expansion of $0.02\times10^{-7}$/° C. at 20° C., a Young's modulus of 67 GPa, a Poisson's ratio of 0.17, and a specific stiffness of $3.07\times10^7$ $m^2/s^2$. The quality assurance region of the first principal surface 10a of the substrate 10 had a root mean square roughness Rq of 0.15 nm or less and a flatness of 100 nm or less, which were obtained by polishing. A Cr film having a thickness of 100 nm was formed over the second principal surface 10b of the substrate 10 by employing a magnetron sputtering method. The sheet resistance of the Cr film was 100 Ω/□.

A Mo/Si multilayered reflection film was formed as the multilayered reflection film 11. The Mo/Si multilayered reflection film was formed by repeating forming a Si layer (having a film thickness of 4.5 nm) and a Mo layer (having a film thickness of 2.3 nm) by employing an ion beam sputtering method forty times. The total film thickness of the Mo/Si multilayered reflection film was 272 nm ((4.5 nm+2.3 nm)×40).

The film forming method for forming the uppermost layer of the multilayered reflection film 11 is indicated in Table 1. In Table 1, "IBD" stands for a ion beam sputtering method, and "MS" stands for a magnetron sputtering method. "MS (formation of SiON layer)" means that a layer containing Si, O, and N was formed by a reactive magnetron sputtering method. The element ratio (N/Si) and the element ratio (O/Si) indicated in Table 1 were measured using an X-ray photoelectron spectroscope (PHI 5000 VersaProbe) obtained from Ulvac-Phi, Inc.

As the reflectance adjusting film 15, a Ru film (having a film thickness of 1.0 nm) was formed by an ion beam sputtering method or a DC sputtering method in Example 3, Example 6, and Example 7, and Nb film (having a film thickness of 1.0 nm) was formed by a DC sputtering method in Example 8. No reflectance adjusting film 15 was formed in Example 1, Example 2, Example 4, Example 5, Example 9, and Example 10.

As the protection film 12, a Rh film (having a film thickness of 2.5 nm) was formed. The Rh film was formed by employing a DC sputtering method. The thickness T of a mixing layer indicated in Table 1 was measured using a TEM image. The mixing layer was a layer that occurred due to inter-diffusion between the protection film 12 and the uppermost layer of the multilayered reflection film 11 during formation of the protection film 12. The thickness T of the mixing layer indicates the degree of mixing. As mixing is greater, the thickness T of the mixing layer is greater.

After the protection film 12 was formed, the root mean square roughness Rq of the surface of the protection film 12 was measured before forming the absorption film 13. The result of the measurement is indicated in Table 1. The root mean square roughness Rq of the surface of the protection film 12 indicated in Table 1 was measured according to Japanese Industrial Standards (JIS) B0601:2013. The root mean square roughness Rq indicates the degree of surface roughness.

As the absorption film 13, a RuN film (having a film thickness of 35 nm) was formed. The RUN film was formed by employing a reactive sputtering method. Subsequently, the absorption film 13 was exposed to an oxygen-based gas used for forming the opening pattern 13a. Here, presence or absence of diffusion i.e., whether any easily oxidizable element had diffused to the surface of the protection film 12 was inspected. The easily oxidizable element was Si contained in the uppermost layer of the multilayered reflection film 11 in Example 1 to Example 7, Example 9, and Example 10, and was Nb contained in the reflectance adjusting film 15 in Example 8. Presence or absence of diffusion is indicated in Table 1. Presence or absence of diffusion was inspected using TEM-EDX.

The film forming conditions and evaluation results of the reflective mask blanks 1 obtained in Example 1 to Example 10 are indicated in Table 1.

TABLE 1

| | Protection film | Reflectence adjuating film | N/Si | O/Si | Uppermost layer of multilayered reflection film Film forming method | T [nm] | Rq [nm] | Diffusion |
|---|---|---|---|---|---|---|---|---|
| Ex. 1 | Rh | — | 0.21 | 0.00 | IBD (formation of Si layer) + radical nitriding | 1.6 | 0.10 | Absent |
| Ex. 2 | Rh | — | 0.18 | 0.05 | MS (formation of SiON layer) | 1.5 | 0.17 | Absent |
| Ex. 3 | Rh | Ru | 0.16 | 0.01 | MS (formation of SiON layer) | 1.3 | 0.12 | Absent |
| Ex. 4 | Rh | — | 0.00 | 0.00 | MS (formation of Si layer) | 4.6 | 0.17 | Present |
| Ex. 5 | Rh | — | 0.23 | 0.44 | MS (formation of Si layer) + radical nitriding + air oxidization | 0.5 | 0.31 | Absent |
| Ex. 6 | Rh | Ru | 0.00 | 0.00 | MS (formation of Si layer) | 2.1 | 0.12 | Present |
| Ex. 7 | Rh | Ru | 0.20 | 0.50 | MS (formation of Si layer) + radical nitriding + air oxidization | 0.55 | 0.22 | Absent |
| Ex. 8 | Rh | Nb | 0.21 | 0.44 | MS (formation of Si later) + radical nitriding + air oxidination | — | — | Present |
| Ex. 9 | Rh | — | 0.12 | 0.11 | MS (formation of SiON layer) | 1.7 | 0.12 | Absent |
| Ex. 10 | Rh | — | 0.11 | 0.35 | MS (formation of SiON layer) | 1.6 | 0.12 | Absent |

As indicated in Table 1, in Example 1, Example 2, Example 9, and Example 10, the element ratio (N/Si) was greater than 0.00 and less than 1.50 and the element ratio (O/Si) was 0.00 or greater and less than 0.44 in the uppermost layer of the multilayered reflection film 11. Hence, in Example 1, Example 2, Example 9, and Example 10, the thickness T of the mixing layer was small, the root mean square roughness Rq of the surface of the protection film 12 was small, and no elemental diffusion to the surface of the protection film 12 was confirmed. That is, in Example 1, Example 2, Example 9, and Example 10, even in a case where the protection film 12 was a Rh film, it was possible to inhibit mixing of the protection film 12 and the multilayered reflection film 11, surface roughening of the protection film 12, and elemental diffusion to the surface of the protection film 12. Moreover, from Example 1, Example 2, Example 9, and Example 10, it can be seen that the element ratios (N/Si and O/Si) were important irrespective of the film forming method for forming the uppermost layer of the multilayered reflection film 11. FIG. 7 illustrates a STEM image and elemental mapping images of the reflective mask blank of Example 1. Also from FIG. 7, it can be seen that the thickness T of the mixing layer was small in Example 1.

Figure 8:
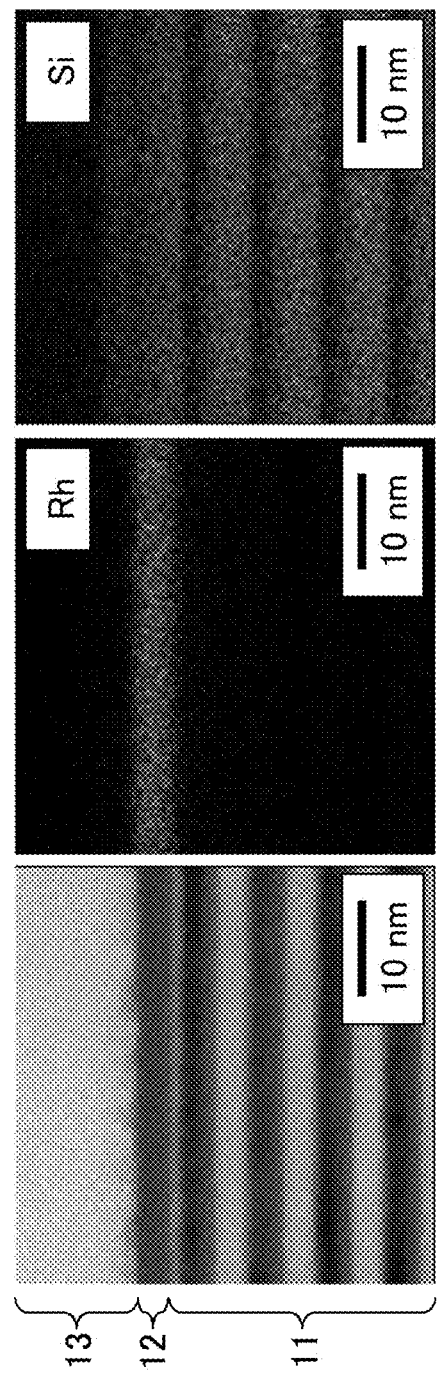
FIG. 8 is a drawing illustrating a STEM image and elemental mapping images of a reflective mask blank of Example 4.

On the other hand, in Example 4, the element ratio (N/Si) and the element ratio (O/Si) were both 0.00. Hence, although the root mean square roughness Rq of the surface of the protection film 12 was good, the thickness T of the mixing layer of the protection film 12 was large and elemental diffusion to the surface of the protection film 12 was confirmed. FIG. 8 illustrates a STEM image and elemental mapping images of the reflective mask blank of Example 4. From FIG. 8, it can be seen that the thickness of the uppermost layer of the multilayered reflection film 11 was small, and that mixing of the uppermost layer of the multilayered reflection film 11 and the protection film 12 had occurred.

Figure 9:
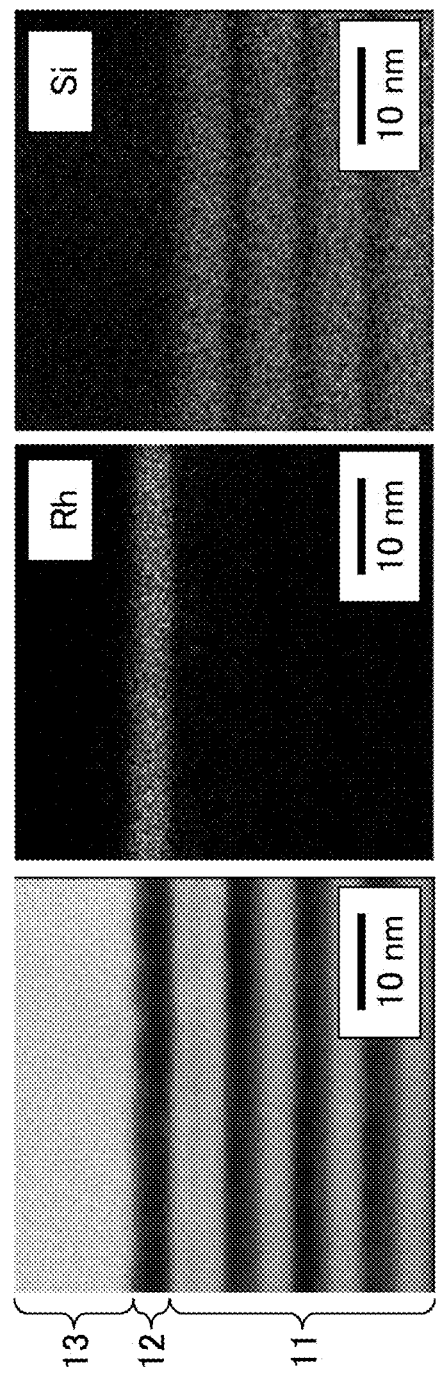
FIG. 9 is a drawing illustrating a STEM image and elemental mapping images of a reflective mask blank of Example 5.

In Example 5, because the element ratio (N/Si) was greater than 0.00 and less than 1.50, the thickness T of the mixing layer was small, and no elemental diffusion to the surface of the protection film 12 was confirmed. FIG. 9 illustrates a STEM image and elemental mapping images of the reflective mask blank of Example 5. Also from FIG. 9, it can be seen that the thickness T of the mixing layer was small in Example 5. However, the element ratio (O/Si) was greater than 0.44 in Example 5, and the root mean square roughness Rq of the surface of the protection film 12 was large.

As is clear from comparison between Example 3, and Example 6 and Example 7, it can be seen that the composition in the uppermost layer of the multilayered reflection film 11 was important in a case of forming the reflectance adjusting film 15 between the multilayered reflection film 11 and the protection film 12 as in a case of forming no reflectance adjusting film 15. As long as the element ratio (N/Si) is greater than 0.00 and less than 1.50 and the element ratio (O/Si) is 0.00 or greater and less than 0.44 in the uppermost layer of the multilayered reflection film 11, it can be seen to be possible to inhibit mixing of the protection film 12 and the multilayered reflection film 11, surface roughening of the protection film 12, and elemental diffusion to the surface of the protection film 12 even in a case where the protection film 12 is a Rh film.

Figure 10:
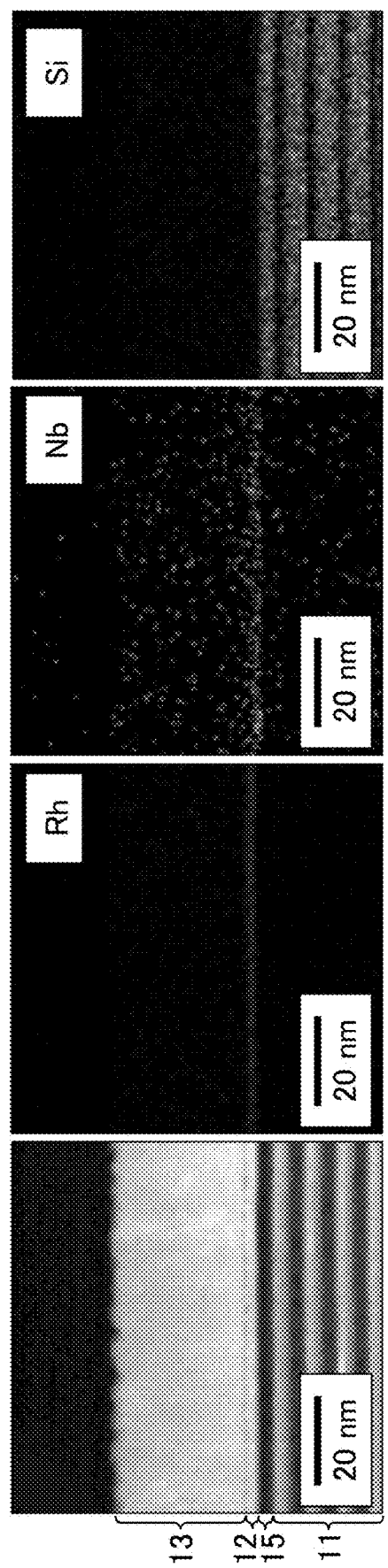
FIG. 10 is a drawing illustrating a STEM image and elemental mapping images of a reflective mask blank of Example 8.
Figure 11:
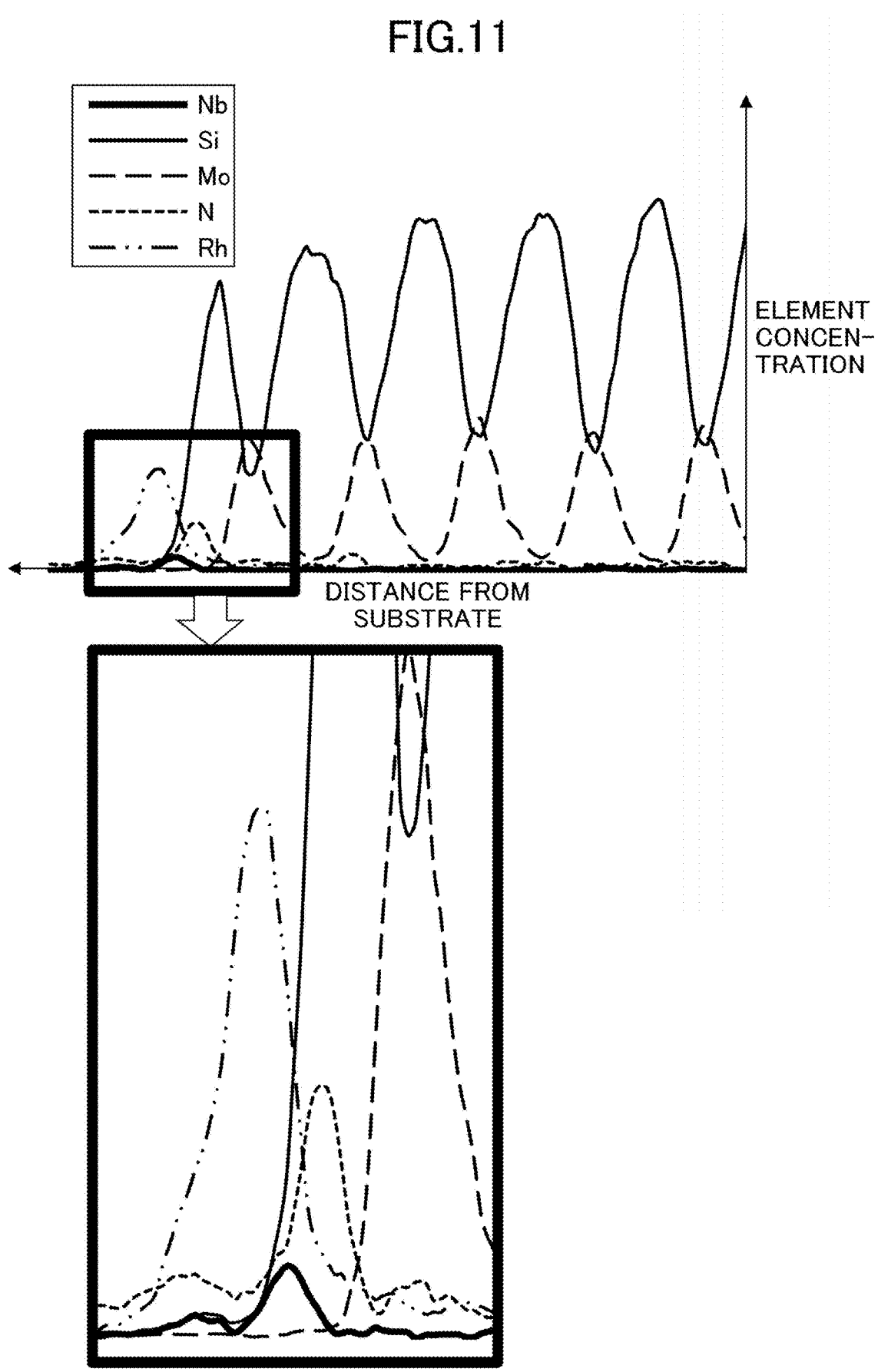
FIG. 11 is a graph of element concentration distribution in a reflective mask of Example 8.

In Example 8, a Nb film was formed as the reflectance adjusting film 15 between the Si layer, which was the uppermost layer of the multilayered reflection film 11, and the Rh film, which was the protection film 12. FIG. 10 illustrates a STEM image and elemental mapping images of the reflective mask blank of Example 8. Also from FIG. 10, it can be seen to be possible to inhibit mixing of the protection film 12 and the multilayered reflection film 11 by forming the Nb film. However, as indicated in Table 1, elemental diffusion to the surface of the protection film 12 was confirmed in Example 8. FIG. 11 illustrates the element concentration distribution after the reflective mask blank 1 of Example 8 was exposed to an oxygen-based gas. As illustrated in FIG. 11, other Nb peaks were present on the left-hand side of the maximum Nb peak (on the side of the maximum Nb peak farther from the substrate 10). This indicates that Nb diffused to the surface of the protection film 12 when the protection film 12 was exposed to the oxygen-based gas.

The reflective mask blank, the reflective mask, the method for producing a reflective mask blank, and a method for producing a reflective mask according to the present disclosure have been described. The present disclosure is not limited to the embodiment described above, and the like. Various changes, modifications, replacements, additions, deletions, and combinations are applicable within the scope of what is described in the claims. These are naturally included within the technical scope of the present disclosure.

What is claimed is:

1. A reflective mask blank, comprising in an order of reciting:
   a substrate;
   a multilayered reflection film configured to reflect EUV rays;
   a protection film configured to protect the multilayered reflection film; and
   an absorption film configured to absorb the EUV rays,
   wherein the protection film contains Rh as a main component,
   the multilayered reflection film includes an uppermost layer that is closest to the protection film in the multilayered reflection film and contains Si and N,
   in the uppermost layer, an element ratio (N/Si) of N to Si is greater than 0.00 and less than 1.50, and an element ratio (O/Si) of O to Si is 0.00 or greater and less than 0.44, and
   the reflective mask blank comprises a reflectance adjusting film containing Ru as a main component between the multilayered reflection film and the protection film.

2. The reflective mask blank according to claim 1,
   wherein in the uppermost layer, the element ratio (N/Si) of N to Si is greater than 0.00 and less than 1.50, and the element ratio (0/Si) of O to Si is 0.00 or greater and less than 0.25.

3. The reflective mask blank according to claim 1,
   wherein the protection film contains Rh, or either or both of Ru and Pd in addition to Rh as a metal element.

4. The reflective mask blank according to claim 1,
   wherein a root mean square roughness Rq of a surface of the protection film is 0.05 nm or greater and 0.20 nm or less.

5. The reflective mask blank according to claim 1,
   wherein a film thickness of the protection film is from 1.0 nm through 4.0 nm.

6. The reflective mask blank according to claim 1,
   wherein a film thickness of the reflectance adjusting film is from 0.1 nm through 2.0 nm.

7. A reflective mask, comprising
   the reflective mask blank of claim 1,
   wherein the absorption film includes an opening pattern.

* * * * *